(12) United States Patent
Do et al.

(10) Patent No.: US 7,834,430 B2
(45) Date of Patent: Nov. 16, 2010

(54) DROP-MOLD CONFORMABLE MATERIAL AS AN ENCAPSULATION FOR AN INTEGRATED CIRCUIT PACKAGE SYSTEM

(75) Inventors: Byung Tai Do, Singapore (SG); Heap Hoe Kuan, Singapore (SG); Rui Huang, Singapore (SG)

(73) Assignee: Stats Chippac Ltd., Singapore (SG)

( * ) Notice: Subject to any disclaimer, the term of this patent is extended or adjusted under 35 U.S.C. 154(b) by 26 days.

(21) Appl. No.: 12/203,332

(22) Filed: Sep. 3, 2008

(65) Prior Publication Data

US 2009/0127720 A1    May 21, 2009

Related U.S. Application Data

(60) Provisional application No. 60/988,724, filed on Nov. 16, 2007.

(51) Int. Cl.
  *H01L 23/495*    (2006.01)
(52) U.S. Cl. .................. 257/666; 257/687; 257/E23.06
(58) Field of Classification Search .................. 257/666, 257/667, 687, 787, E23.06
  See application file for complete search history.

(56) References Cited

U.S. PATENT DOCUMENTS

| | | | |
|---|---|---|---|
| 7,482,686 B2 | 1/2009 | Zhao et al. | |
| 7,501,693 B2 * | 3/2009 | Chu et al. | 257/676 |
| 7,629,677 B2 | 12/2009 | Youn et al. | |
| 2005/0205996 A1 | 9/2005 | Usui et al. | |
| 2006/0275952 A1 | 12/2006 | Gowda et al. | |
| 2007/0108621 A1 | 5/2007 | Park | |
| 2009/0127680 A1 | 5/2009 | Do et al. | |
| 2009/0127683 A1 | 5/2009 | Do et al. | |

FOREIGN PATENT DOCUMENTS

| | | |
|---|---|---|
| JP | 61-158153 A | 7/1986 |
| JP | 2001-018330 A | 1/2001 |
| JP | 2003-100807 A | 4/2003 |
| WO | 2006054473 A1 | 5/2006 |

* cited by examiner

*Primary Examiner*—Hoai V Pham
(74) *Attorney, Agent, or Firm*—Mikio Ishimaru

(57) ABSTRACT

An integrated circuit package system includes: providing an integrated circuit; mounting a lead on the periphery of the integrated circuit; connecting the integrated circuit to the lead with an interconnect; and forming a conformable material by pressing the conformable material on the integrated circuit, the lead, and the interconnect.

17 Claims, 8 Drawing Sheets

DROP-MOLD CONFORMABLE MATERIAL AS AN ENCAPSULATION FOR AN INTEGRATED CIRCUIT PACKAGE SYSTEM

CROSS-REFERENCE TO RELATED APPLICATION(S)

This application claims the benefit of U.S. Provisional Patent Application Ser. No. 60/988,724 filed Nov. 16, 2007.

The present application contains subject matter related to co-pending U.S. patent application Ser. No. 12/121,752. The related application is assigned to STATS ChipPAC Ltd.

The present application also contains subject matter related to co-pending U.S. patent application Ser. No. 12/126,684. The related application is assigned to STATS ChipPAC Ltd.

TECHNICAL FIELD

The present invention relates generally to integrated circuits and more particularly to a system for utilizing a drop-mold conformable material as an encapsulation for an integrated circuit.

BACKGROUND ART

The rapidly growing portable electronics market, e.g. cellular phones, laptop computers, and PDAs, are an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high-speed computer devices that are projected to exceed one TeraHertz (THz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors, which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides an integrated circuit package system that includes: providing an integrated circuit; mounting a lead on the periphery of the integrated circuit; connecting the integrated circuit to the lead with an interconnect; and forming a conformable material by pressing the conformable material on the integrated circuit, the lead, and the interconnect.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
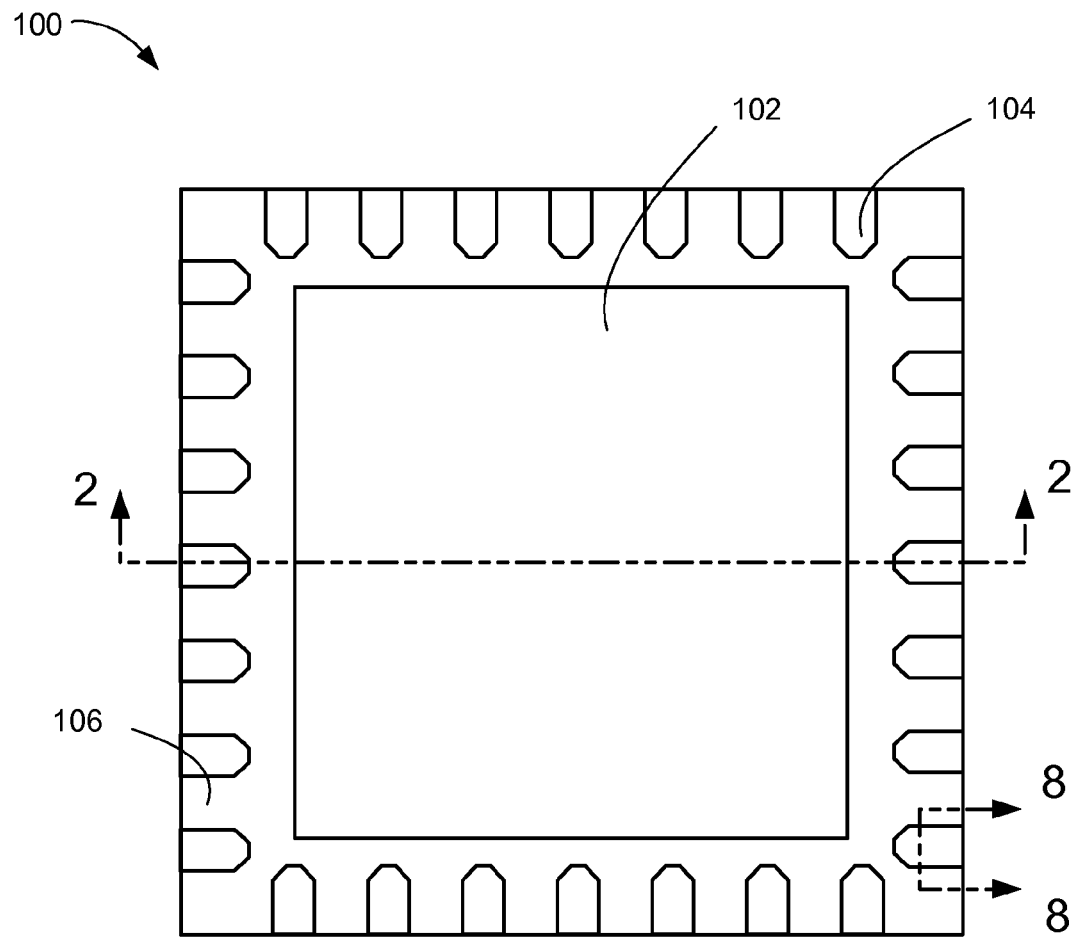
FIG. 1 is a bottom plan view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. The same numbers are used in all the drawing FIGs. to relate to the same elements. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "processing" as used herein includes deposition of material or photoresist, patterning, exposure, development, etching, cleaning, and/or removal of the material or photoresist as required in forming a described structure. The term "system" as used herein refers to and is defined as the method and as the apparatus of the present invention in accordance with the context in which the term is used.

Referring now to FIG. 1, therein is shown a bottom plan view of an integrated circuit package system 100 in a first embodiment of the present invention. The integrated circuit package system 100 is shown having an integrated circuit 102.

On the periphery of the integrated circuit 102, are leads 104. Partially encapsulating the integrated circuit 102 and the leads 104 is a conformable material 106.

Figure 2:
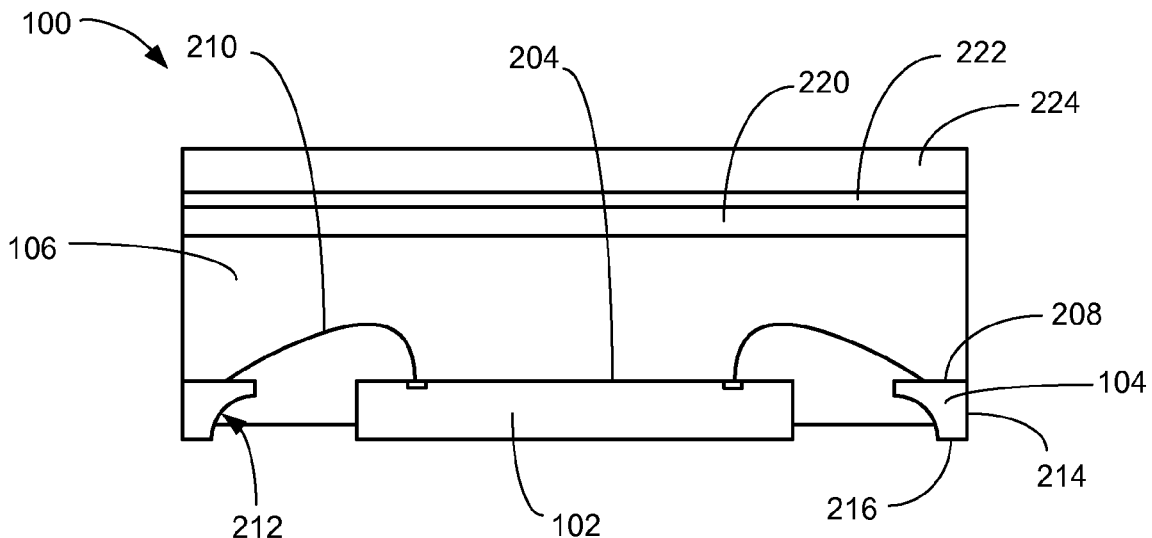
FIG. 2 is a cross-sectional view of the integrated circuit package system taken along line 2-2 of FIG. 1.

Referring now to FIG. 2, therein is shown a cross-sectional view of the integrated circuit package system 100 taken along line 2-2 of FIG. 1. The integrated circuit package system 100 is shown with the integrated circuit 102 such as a wire-bonded die having an active side 204.

On the periphery of the integrated circuit 102, the leads 104 are shown having an upper surface 208. The upper surface 208 of the leads 104 are connected to the active side 204 of the integrated circuit 102 with interconnects 210 such as bond wires.

The leads 104 are shown having a half-etched portion 212 below the upper surface 208 of the leads 104. The leads 104 are further shown exposed along a side 214 and a bottom 216, providing more area exposed for wetting during board level attachment and board level reliability can be improved.

The leads 104 may be pre-plated with Ni, Pt, Au or any combination of them. The leads 104 also can be arranged in single or multiple row formats to match multiple levels of stacked die.

Encapsulating the interconnects 210 and partially encapsulating the integrated circuit 102 and the leads 104, is the conformable material 106. The conformable material 106 has a low viscosity and, as temperature increases, the viscosity gets lower.

Therefore, the conformable material 106 can be easily pressed over the interconnects 210, above, and around the integrated circuit 102 and the leads 104, and then cured to harden the conformable material 106.

The leads 104 can be any shape and cross-section, such as T shape, trapezoid, L shape, etc, that enhances mechanical locking effect with the conformable material 106. The conformable material 106 is shown only partially encapsulating the half-etched portion 212 of the leads 104.

It has been discovered that the conformable material 106 should be a thermally conductive dielectric material. The conformable material 106 can be made of a B-stage material that can be hardened after curing.

The conformable material 106 should be about 100° C. while encapsulating the integrated circuit 102 before curing. The viscosity of the conformable material 106 may be in a range of 10 Pa to 2000 Pa. It has still further been discovered that the elastic modulus of the conformable material 106 before curing (B-stage) should be less than 300 MPa, and it should be greater than 3000 MPa after curing.

There should preferably be a difference about 10 X before and after curing. The elastic modulus should also drop as temperature increases before and after curing. Above the conformable material 106, a buffer layer 220 is mounted.

The buffer layer 220 is used to compensate for the coefficient of thermal expansion mismatch between the conformable material 106 and an adhesive layer 222 attached above the buffer layer 220. It is preferable that the buffer layer 220 is made of an insulation material.

The adhesive layer 222 may be applied to secure a stiffener 224 above the buffer layer 220. The buffer layer 220, the adhesive layer 222, and the stiffener 224 are preferably thermally conductive to shed excess heat generated by the operation of the integrated circuit 102.

The stiffener 224 may be made of organic, metal, ceramic or other material, which is stiff enough to act as a support for the conformable material 106 in its uncured or viscous state.

When the stiffener 224 is made by thermal or electrical conductive material, it can function as heat sink or electromagnetic interference shielding layer. The stiffener 224 may also be removed at any time after the conformable material 106 is cured.

Figure 3:
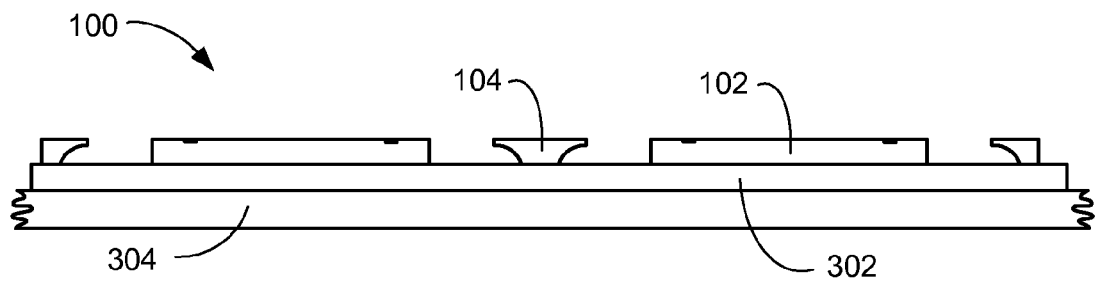
FIG. 3 is the integrated circuit package system of FIG. 2 in a post lead providing phase of manufacture.

Referring now to FIG. 3 is the integrated circuit package system 100 of FIG. 2 in a post lead providing phase of manufacture. The integrated circuit package system 100 is shown having the integrated circuit 102 and the leads 104 mounted atop a provisional chip carrier 302.

The provisional chip carrier 302 can be a dummy silicon wafer, metal foil, tape or any known form of temporary chip carrier. The provisional chip carrier 302 may be set on a convey belt 304.

The convey belt 304 can transport the integrated circuit package system 100 to various phases of manufacture.

Figure 4:
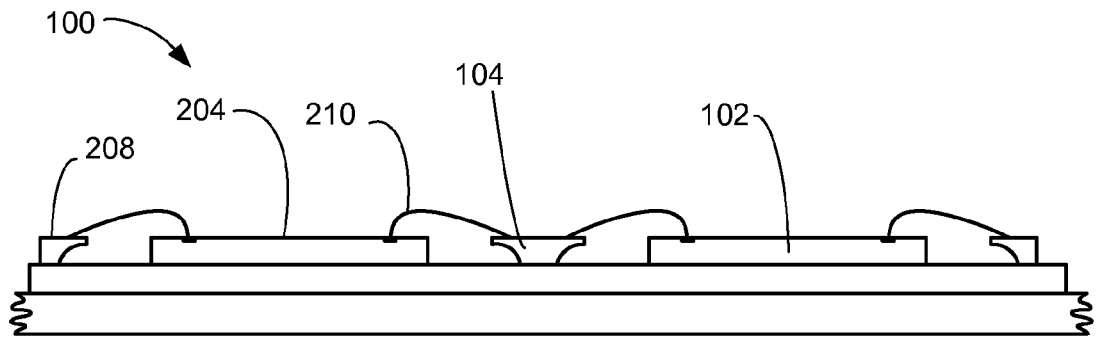
FIG. 4 is the integrated circuit package system of FIG. 2 in a wire-bonding phase of manufacture.

Referring now to FIG. 4 is the integrated circuit package system 100 of FIG. 2 in a wire-bonding phase of manufacture. The integrated circuit package system 100 is shown having the active side 204 of the integrated circuit 102 connected to the leads 104 with the interconnects 210.

Figure 5:
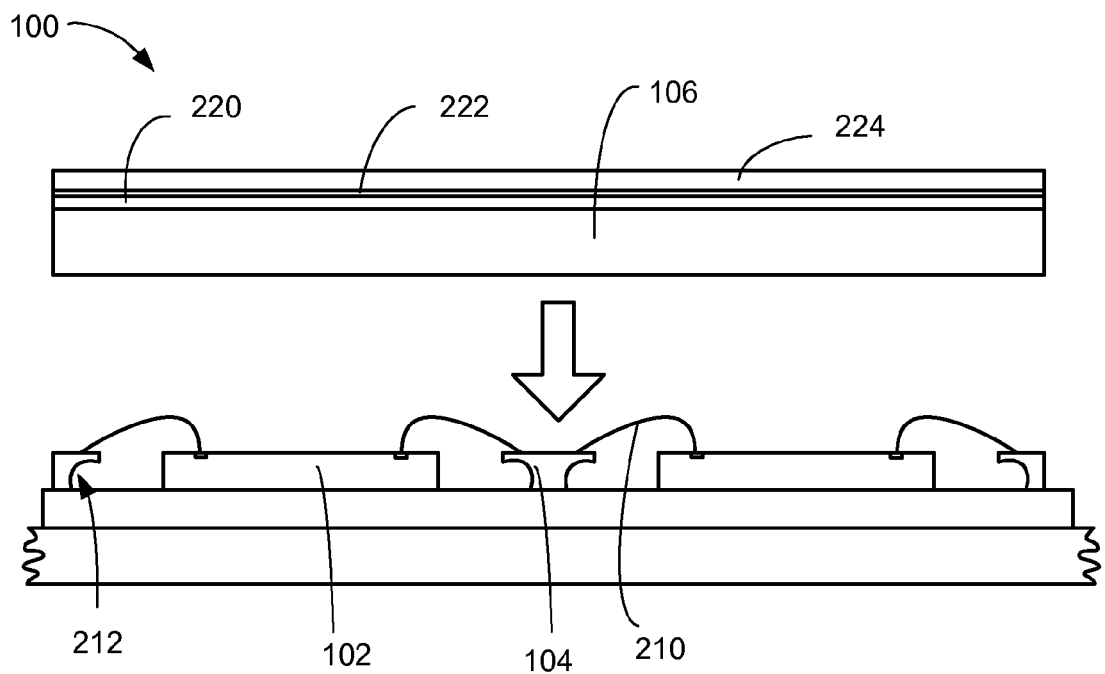
FIG. 5 is the integrated circuit package system of FIG. 2 in a drop conformable material-attaching phase of manufacture.

Referring now to FIG. 5 is the integrated circuit package system 100 of FIG. 2 in a drop conformable material-attaching phase of manufacture. The integrated circuit package system 100 is shown having the conformable material 106 with the buffer layer 220, the adhesive layer 222, and the stiffener 224 all attached above the conformable material 106 and being pressed over the integrated circuit 102 and the leads 104.

Figure 6:
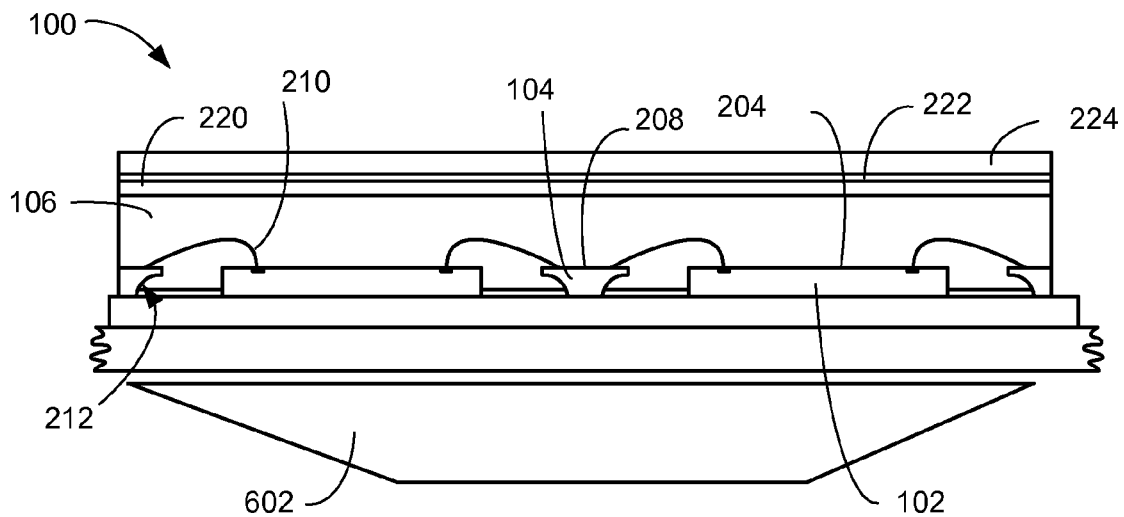
FIG. 6 is the integrated circuit package system of FIG. 2 in a curing phase of manufacture.

Referring now to FIG. 6 is the integrated circuit package system 100 of FIG. 2 in a curing phase of manufacture. The integrated circuit package system 100 is shown having the conformable material 106 being cured by radiation 602 such as infrared or ultra violet radiation.

Figure 7:
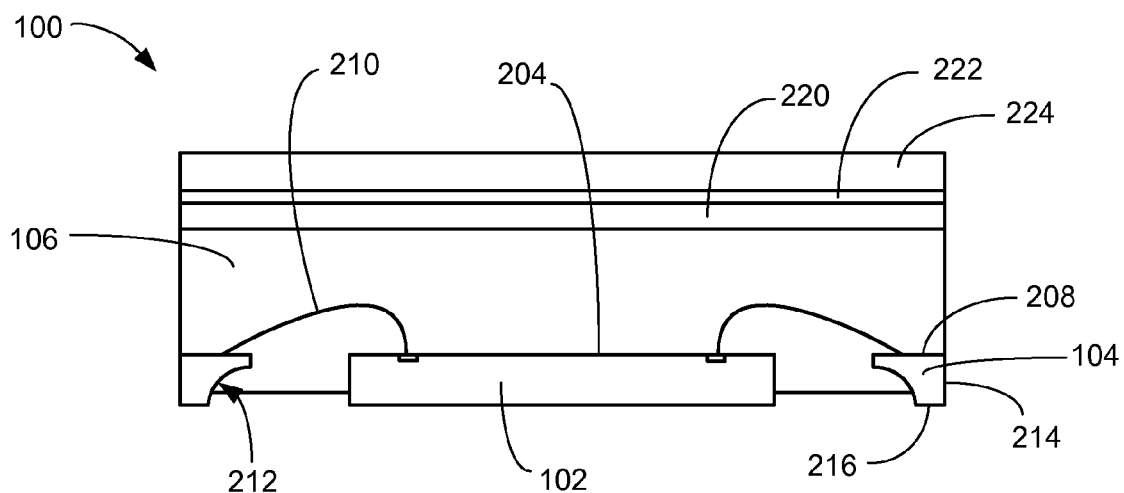
FIG. 7 is the integrated circuit package system of FIG. 2 in a post singulation phase of manufacture.

Referring now to FIG. 7 is the integrated circuit package system 100 of FIG. 2 in a post singulation phase of manufacture. The integrated circuit package system 100 is shown having the conformable material 106 cured, singulated and only partially encapsulating the half-etched portion 212 of the leads 104.

Since an attaching and curing phase can replace a conventional molding process, the manufacturing cost can be reduced in terms of simpler process and reduced process steps. As a result, less equipment investment and cost reduction can be achieved.

Since no mold compound is used, there is no chemical or mechanical deflash process for mold flash removal from external I/Os, especially for multi-row configuration that encountered mold flash on lead during manufacturing.

Since the manufacturing process has been simplified, an in-line assembly system can be used to improve productivity, shorten cycle time, and minimize the human error factor.

Figure 8:
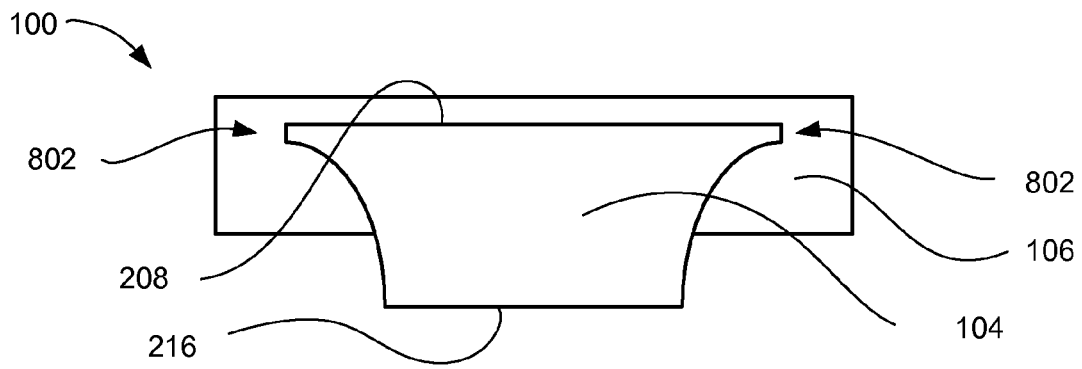
FIG. 8 is a cross-sectional view along the line 8-8 of FIG. 1.

Referring now to FIG. 8, therein is shown a cross-sectional view along line 8-8 of FIG. 1. The integrated circuit package system 100 is shown having the lead 104 with two lengthwise sides 802 the upper surface 208 and the bottom 216. The two lengthwise sides 802 have the half-etched portion 212 near the bottom 216.

The conformable material 106 only partially encapsulates the lead 104 on the upper surface 208 and part of the half-etched portion 212 leaving the bottom 216 of the lead 104 exposed from the conformable material 106

Figure 9:
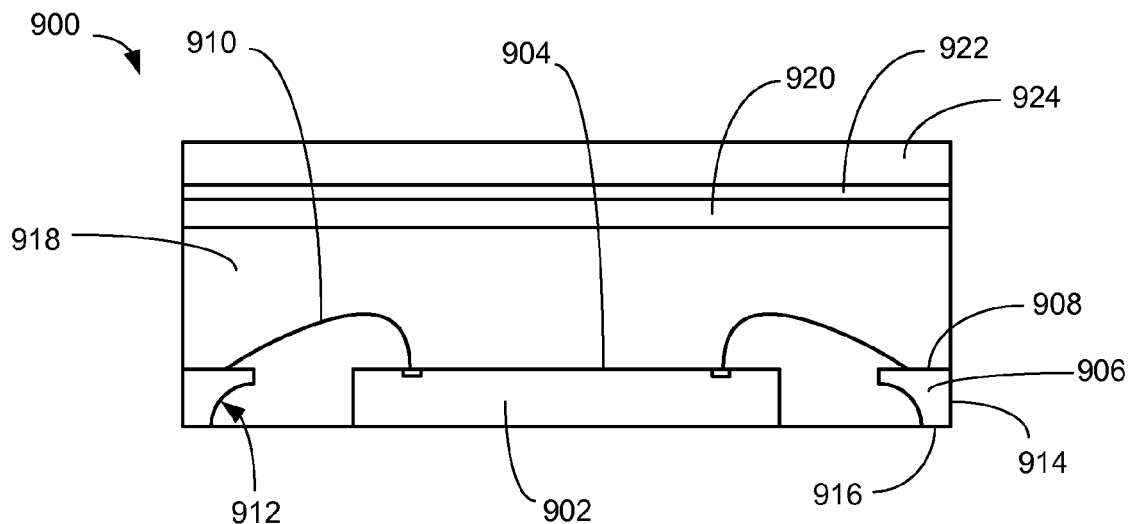
FIG. 9 is a cross-sectional view of an integrated circuit package system in a second embodiment of the present invention.

Referring now to FIG. 9, therein is shown a cross-sectional view of an integrated circuit package system 900 in a second embodiment of the present invention. The integrated circuit package system 900 is shown having an integrated circuit 902 such as a wire-bonded die with an active side 904.

On the periphery of the integrated circuit 902, are leads 906 having an upper surface 908. The upper surface 908 of the leads 906 are connected to the active side 904 of the integrated circuit 902 with interconnects 910 such as bond wires.

The leads 906 are shown having a half-etched portion 912 below the upper surface 908 of the leads 906. The leads 906 are further shown exposed along a side 914 and a bottom 916. The leads 906 may be pre-plated with Ni, Pt, Au or any combination of them. The leads 906 also can be arranged in single or multiple row formats to match multiple levels of stacked die.

Encapsulating the interconnects 910 and partially encapsulating the integrated circuit 902 and the leads 906, is a conformable material 918. The conformable material 918 has a low viscosity and, as temperature increases, the viscosity gets lower.

Therefore, the conformable material 918 can be easily pressed over the interconnects 910, above, and around the integrated circuit 902 and the leads 906, and then cured to harden the conformable material 918.

The leads 906 can be any shape and cross-section, such as T shape, trapezoid, L shape, etc, that enhances mechanical locking effect with the conformable material 918. The conformable material 918 is shown encapsulating the half-etched portion 912 of the leads 906 to a point co-planar with the bottom 916 of the leads 906.

It has been discovered that the conformable material 918 should be a thermally conductive dielectric material. The conformable material 918 can be made of a B-stage material that can be hardened after curing and can maintain a predetermined thickness.

The conformable material 918 should be about 100° C. while encapsulating the integrated circuit 902 before curing. The viscosity of the conformable material 918 may be in a range of 10 Pa to 2000 Pa. It has still further been discovered that the elastic modulus of the conformable material 918 before curing (B-stage) should be less than 300 MPa, and it should be greater than 3000 MPa after curing.

There should preferably be a difference about 10 X before and after curing. The elastic modulus should also drop as temperature increases before and after curing. Above the conformable material 918, a buffer layer 920 is mounted.

The buffer layer 920 is used to compensate for the coefficient of thermal expansion mismatch between the conformable material 918 and an adhesive layer 922 attached above the buffer layer 920. It is preferable that the buffer layer 920 is made of an insulation material.

The adhesive layer 922 may be applied to secure a stiffener 924 above the buffer layer 920. The buffer layer 920, the adhesive layer 922, and the stiffener 924 are preferably thermally conductive to shed excess heat generated by the operation of the integrated circuit 902.

The stiffener 924 may be made of organic, metal, ceramic or other material, which is stiff enough to act as a support for the conformable material 918 in its uncured or viscous state. When the stiffener 924 is made by thermal or electrical conductive material, it can function as heat sink or electromagnetic interference shielding layer.

Figure 10:
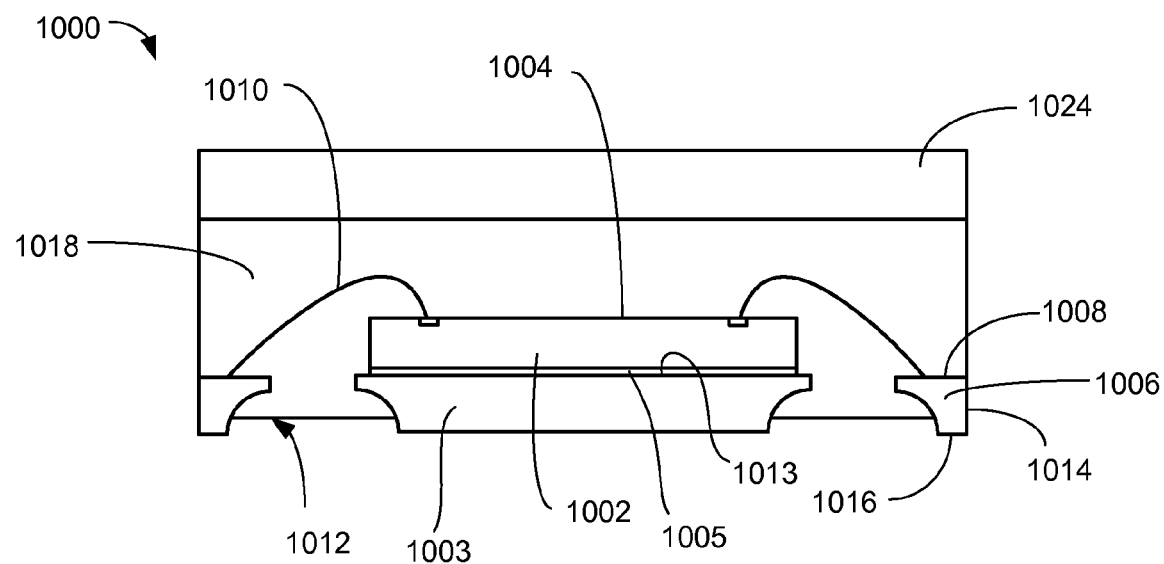
FIG. 10 is a cross-sectional view of an integrated circuit package system in a third embodiment of the present invention.

Referring now to FIG. 10, therein is shown a cross-sectional view of an integrated circuit package system 1000 in a third embodiment of the present invention. The integrated circuit package system 1000 is shown having an integrated circuit 1002 such as a wire-bonded die.

The integrated circuit 1002 is mounted over a die pad 1003. The integrated circuit 1002 has an active side 1004. The integrated circuit 1002 is attached to the die pad 1003 with a die attach adhesive 1005.

On the periphery of the integrated circuit 1002, are leads 1006 having an upper surface 1008. The upper surface 1008 of the leads 1006 are connected to the active side 1004 of the integrated circuit 1002 with interconnects 1010 such as bond wires.

The leads 1006 are shown having a half-etched portion 1012 below the upper surface 1008 of the leads 1006. The die pad 1003 is also shown having the half-etched portion 1012 below an upper surface 1013 of the die pad 1003.

The leads 1006 are further shown exposed along a side 1014, a bottom 1016, and along part of the half-etched portion 1012. The leads 1006 may be pre-plated with Ni, Pt, Au or any combination of them. The leads 1006 also can be arranged in single or multiple row formats to match multiple levels of stacked die.

Encapsulating the interconnects 1010 and the integrated circuit 1002 and partially encapsulating the leads 1006, is a conformable material 1018. The conformable material 1018 has a low viscosity and, as temperature increases, the viscosity gets lower.

Therefore, the conformable material 1018 can be easily pressed over the interconnects 1010, above, and around the integrated circuit 1002 and the leads 1006, and then cured to harden the conformable material 1018.

The leads 1006 can be any shape and cross-section, such as T shape, trapezoid, L shape, etc, that enhances mechanical locking effect with the conformable material 1018. The conformable material 1018 is shown only partially encapsulating the half-etched portion 1012 of the leads 1006.

The conformable material 1018 is also shown only partially encapsulating the half-etched portion 1012 of the die pad 1003.

It has been discovered that the conformable material 1018 should be a thermally conductive dielectric material. The conformable material 1018 can be made of a B-stage material that can be hardened after curing and can maintain a predetermined thickness.

The conformable material 1018 should be about 100° C. while encapsulating the integrated circuit 1002 before curing. The viscosity of the conformable material 1018 may be in a range of 10 Pa to 2000 Pa. It has still further been discovered that the elastic modulus of the conformable material 1018 before curing (B-stage) should be less than 300 MPa, and it should be greater than 3000 MPa after curing.

There should preferably be a difference about 10 X before and after curing. The elastic modulus should also drop as temperature increases before and after curing. Above the conformable material 1018, a stiffener 1024 is mounted.

The stiffener 1024 may be made of organic, metal, ceramic or other material, which is stiff enough to act as a support for the conformable material 1018 in its uncured or viscous state. When the stiffener 1024 is made by thermal or electrical conductive material, it can function as heat sink or electromagnetic interference shielding layer.

Figure 11:
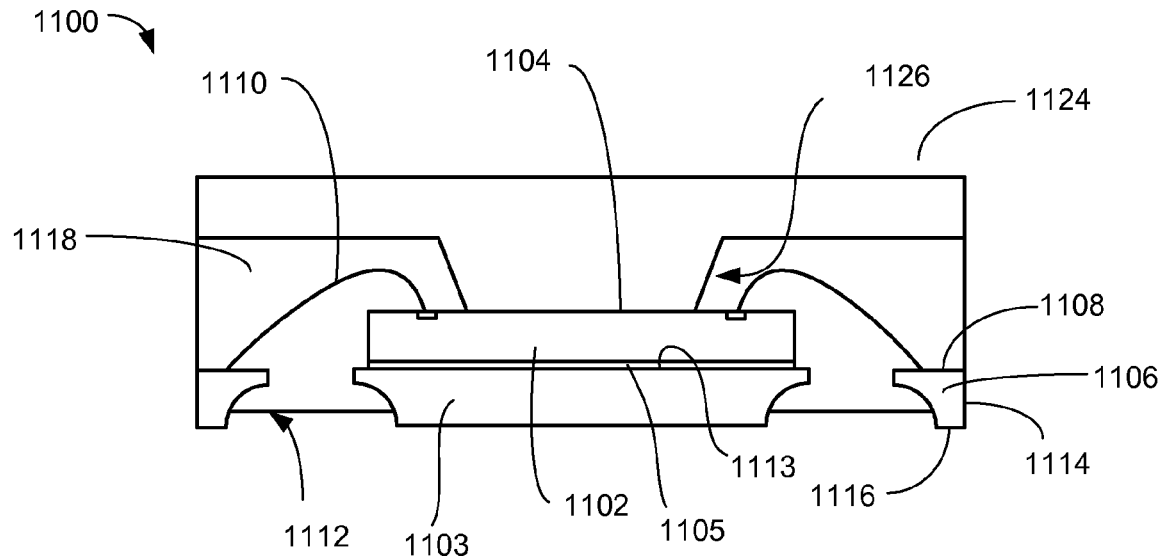
FIG. 11 is a cross-sectional view of an integrated circuit package system in a fourth embodiment of the present invention.

Referring now to FIG. 11, therein is shown a cross-sectional view of an integrated circuit package system 1100 in a fourth embodiment of the present invention. The integrated circuit package system 1100 is shown having an integrated circuit 1102 such as a wire-bonded die.

The integrated circuit 1102 is mounted over a die pad 1103. The integrated circuit 1102 has an active side 1104. The integrated circuit 1102 is attached to the die pad 1103 with a die attach adhesive 1105.

On the periphery of the integrated circuit 1102, are leads 1106 having an upper surface 1108. The upper surface 1108 of the leads 1106 are connected to the active side 1104 of the integrated circuit 1102 with interconnects 1110 such as bond wires.

The leads 1106 are shown having a half-etched portion 1112 below the upper surface 1108 of the leads 1106. The die pad 1103 is also shown having the half-etched portion 1112 below an upper surface 1113 of the die pad 1103.

The leads 1106 are further shown exposed along a side 1114, a bottom 1116, and along part of the half-etched portion 1112. The leads 1106 may be pre-plated with Ni, Pt, Au or any combination of them. The leads 1106 also can be arranged in single or multiple row formats to match multiple levels of stacked die.

Encapsulating the interconnects 1110 and the integrated circuit 1102 and partially encapsulating the leads 1106, is a conformable material 1118. The conformable material 1118 has a low viscosity and, as temperature increases, the viscosity gets lower.

Therefore, the conformable material 1118 can be easily pressed over the interconnects 1110, above, and around the integrated circuit 1102 and the leads 1106, and then cured to harden the conformable material 1118.

The leads 1106 can be any shape and cross-section, such as T shape, trapezoid, L shape, etc, that enhances mechanical locking effect with the conformable material 1118. The conformable material 1118 is shown only partially encapsulating the half-etched portion 1112 of the leads 1106.

The conformable material 1118 is also shown only partially encapsulating the half-etched portion 1112 of the die pad 1103.

It has been discovered that the conformable material 1118 should be a thermally conductive dielectric material. The conformable material 1118 can be made of a B-stage material that can be hardened after curing and can maintain a predetermined thickness.

The conformable material 1118 should be about 100° C. while encapsulating the integrated circuit 1102 before curing. The viscosity of the conformable material 1118 may be in a range of 10 Pa to 2000 Pa. It has still further been discovered that the elastic modulus of the conformable material 1118 before curing (B-stage) should be less than 300 MPa, and it should be greater than 3000 MPa after curing.

There should preferably be a difference about 10 X before and after curing. The elastic modulus should also drop as temperature increases before and after curing. Above the integrated circuit 1102, a stiffener 1124 is mounted.

The stiffener 1124 has a protrusion 1126, which contacts the active side 1104 of the integrated circuit 1102. The stiffener 1124 may be made of organic, metal, ceramic or other material, which is stiff enough to act as a support for the conformable material 1118 in its uncured or viscous state. The protrusion 1126 of the stiffener 1124 functions as a heat sink drawing heat away from the integrated circuit and dissipating the heat over a large surface area.

Figure 12:
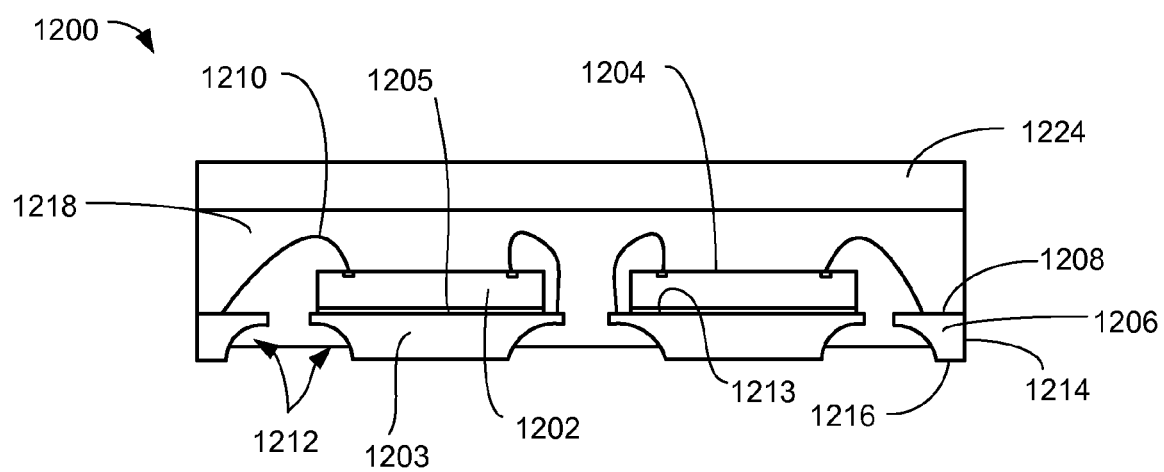
FIG. 12 is a cross-sectional view of an integrated circuit package system in a fifth embodiment of the present invention.

Referring now to FIG. 12, therein is shown a cross-sectional view of an integrated circuit package system 1200 in a fifth embodiment of the present invention. The integrated circuit package system 1200 is shown having integrated circuits 1202 such as dual wire-bonded dies.

The integrated circuits 1202 are mounted over multiple die pads 1203. The integrated circuits 1202 have active sides 1204. The integrated circuits 1202 are attached to the multiple die pads 1203 with a die attach adhesive 1205.

On the periphery of the integrated circuits 1202, are leads 1206 having an upper surface 1208. The upper surface 1208 of the leads 1206 are connected to the active sides 1204 of the integrated circuits 1202 with interconnects 1210 such as bond wires. The active sides 1204 of the integrated circuits 1202 may also be connected to the multiple die pads 1203 with the interconnects 1210.

The leads 1206 are shown having a half-etched portion 1212 below the upper surface 1208 of the leads 1206. The multiple die pads 1203 are also shown having the half-etched portion 1212 below an upper surface 1213 of the multiple die pads 1203.

The leads 1206 are further shown exposed along a side 1214, a bottom 1216, and along part of the half-etched portion 1212. The leads 1206 may be pre-plated with Ni, Pt, Au or any combination of them. The leads 1206 also can be arranged in single or multiple row formats to match multiple levels of stacked die.

Encapsulating the interconnects 1210 and the integrated circuits 1202 and partially encapsulating the leads 1206, is a conformable material 1218. The conformable material 1218 has a low viscosity and, as temperature increases, the viscosity gets lower.

Therefore, the conformable material 1218 can be easily pressed over the interconnects 1210, above, and around the integrated circuits 1202 and the leads 1206, and then cured to harden the conformable material 1218.

The leads 1206 can be any shape and cross-section, such as T shape, trapezoid, L shape, etc, that enhances mechanical locking effect with the conformable material 1218. The conformable material 1218 is shown only partially encapsulating the half-etched portion 1212 of the leads 1206.

The conformable material 1218 is also shown only partially encapsulating the half-etched portion 1212 of the multiple die pads 1203.

It has been discovered that the conformable material 1218 should be a thermally conductive dielectric material. The conformable material 1218 can be made of a B-stage material that can be hardened after curing and can maintain a predetermined thickness.

The conformable material 1218 should be about 100° C. while encapsulating the integrated circuit 1202 before curing. The viscosity of the conformable material 1218 may be in a range of 10 Pa to 2000 Pa. It has still further been discovered that the elastic modulus of the conformable material 1218 before curing (B-stage) should be less than 300 MPa, and it should be greater than 3000 MPa after curing.

There should preferably be a difference about 10 X before and after curing. The elastic modulus should also drop as temperature increases before and after curing. Above the conformable material 1218, a stiffener 1224 is mounted.

The stiffener 1224 may be made of organic, metal, ceramic or other material, which is stiff enough to act as a support for the conformable material 1218 in its uncured or viscous state. When the stiffener 1224 is made by thermal or electrical conductive material, it can function as heat sink or electromagnetic interference shielding layer.

Figure 13:
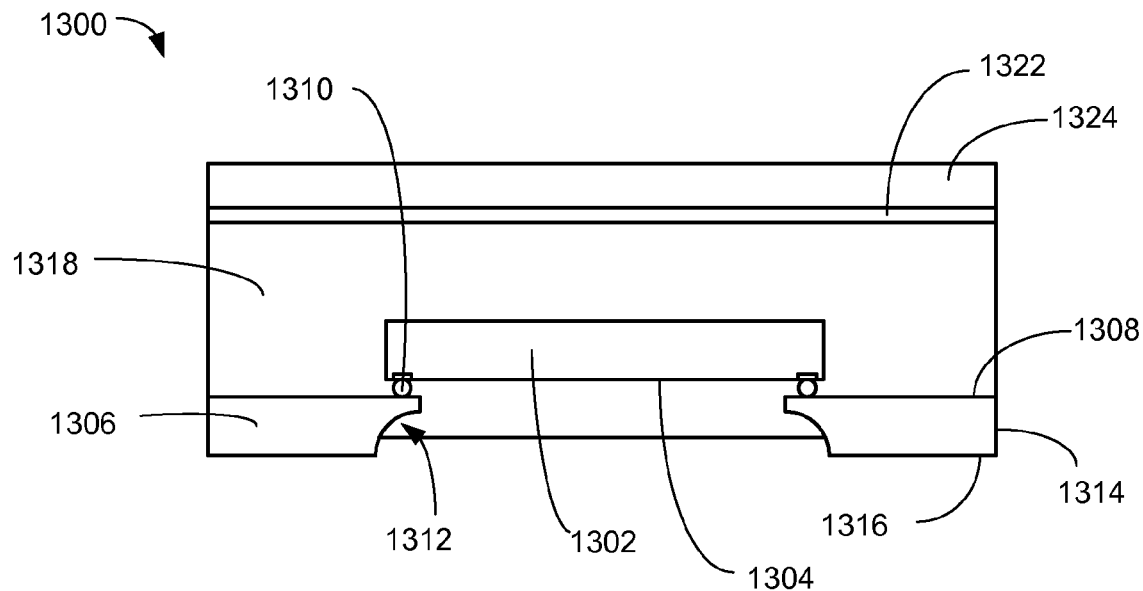
FIG. 13 is a cross-sectional view of an integrated circuit package system in a sixth embodiment of the present invention.

Referring now to FIG. 13, therein is shown a cross-sectional view of an integrated circuit package system 1300 in a sixth embodiment of the present invention. The integrated circuit package system 1300 is shown having an integrated circuit 1302 such as a flip-chip with an active side 1304.

On the periphery and below the integrated circuit 1302, are leads 1306 having an upper surface 1308. The upper surface 1308 of the leads 1306 are connected to the active side 1304 of the integrated circuit 1302 with interconnects 1310 such as solder balls.

The leads 1306 are shown having a half-etched portion 1312 below the upper surface 1308 of the leads 1306. The leads 1306 are further shown exposed along a side 1314, a bottom 1316, and along part of the half-etched portion 1312. The leads 1306 may be pre-plated with Ni, Pt, Au or any combination of them. The leads 1306 also can be arranged in single or multiple row formats to match multiple levels of stacked die.

Encapsulating the interconnects 1310 and the integrated circuit 1302 and partially encapsulating the leads 1306, is a conformable material 1318. The conformable material 1318 has a low viscosity and, as temperature increases, the viscosity gets lower.

Therefore, the conformable material 1318 can be easily pressed over the interconnects 1310, above, and around the integrated circuit 1302 and the leads 1306, and then cured to harden the conformable material 1318.

The leads 1306 can be any shape and cross-section, such as T shape, trapezoid, L shape, etc, that enhances mechanical locking effect with the conformable material 1318. The conformable material 1318 is shown only partially encapsulating the half-etched portion 1312 of the leads 1306.

It has been discovered that the conformable material 1318 should be a thermally conductive dielectric material. The conformable material 1318 can be made of a B-stage material that can be hardened after curing and can maintain a predetermined thickness.

The conformable material 1318 should be about 100° C. while encapsulating the integrated circuit 1302 before curing. The viscosity of the conformable material 1318 may be in a range of 10 Pa to 2000 Pa. It has still further been discovered that the elastic modulus of the conformable material 1318 before curing (B-stage) should be less than 300 MPa, and it should be greater than 3000 MPa after curing.

There should preferably be a difference about 10 X before and after curing. The elastic modulus should also drop as temperature increases before and after curing. An adhesive layer 1322 above the conformable material 1318 may be applied to secure a stiffener 1324 to the conformable material 1318.

The stiffener 1324 may be made of organic, metal, ceramic or other material, which is stiff enough to act as a support for the conformable material 1318 in its uncured or viscous state. When the stiffener 1324 is made by thermal or electrical conductive material, it can function as heat sink or electromagnetic interference shielding layer.

Figure 14:
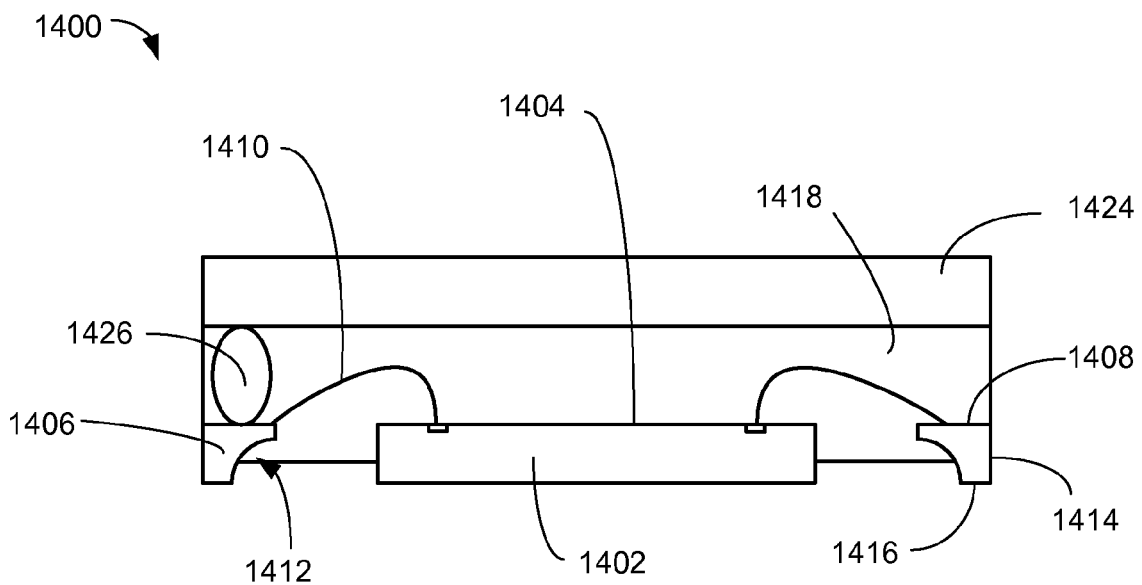
FIG. 14 is a cross-sectional view of an integrated circuit package system in a seventh embodiment of the present invention.

Referring now to FIG. 14, therein is shown a cross-sectional view of an integrated circuit package system 1400 in a seventh embodiment of the present invention. The integrated circuit package system 1400 is shown having an integrated circuit 1402 such as a wire-bonded die with an active side 1404.

On the periphery of the integrated circuit 1402, are leads 1406 having an upper surface 1408. The upper surface 1408 of the leads 1406 are connected to the active side 1404 of the integrated circuit 1402 with interconnects 1410 such as bond wires.

The leads 1406 are shown having a half-etched portion 1412 below the upper surface 1408 of the leads 1406. The leads 1406 are further shown exposed along a side 1414, a bottom 1416, and along part of the half-etched portion 1412. The leads 1406 may be pre-plated with Ni, Pt, Au or any combination of them. The leads 1406 also can be arranged in single or multiple row formats to match multiple levels of stacked die.

Encapsulating the interconnects 1410 and partially encapsulating the integrated circuit 1402 and the leads 1406, is a conformable material 1418. The conformable material 1418 has a low viscosity and, as temperature increases, the viscosity gets lower.

Therefore, the conformable material 1418 can be easily pressed over the interconnects 1410, above, and around the integrated circuit 1402 and the leads 1406, and then cured to harden the conformable material 1418.

The leads 1406 can be any shape and cross-section, such as T shape, trapezoid, L shape, etc, that enhances mechanical locking effect with the conformable material 1418. The conformable material 1418 is shown only partially encapsulating the half-etched portion 1412 of the leads.

It has been discovered that the conformable material 1418 should be a thermally conductive dielectric material. The conformable material 1418 can be made of a B-stage material that can be hardened after curing and can maintain a predetermined thickness.

The conformable material 1418 should be about 100° C. while encapsulating the integrated circuit 1402 before curing. The viscosity of the conformable material 1418 may be in a range of 10 Pa to 2000 Pa. It has still further been discovered that the elastic modulus of the conformable material 1418 before curing (B-stage) should be less than 300 MPa, and it should be greater than 3000 MPa after curing.

There should preferably be a difference about 10 X before and after curing. The elastic modulus should also drop as temperature increases before and after curing. Above the conformable material 1418, a stiffener 1424 is mounted.

The stiffener 1424 may be made of organic, metal, ceramic or other material, which is stiff enough to act as a support for the conformable material 1418 in its uncured or viscous state. When the stiffener 1424 is made by thermal or electrical conductive material, it can function as heat sink or electromagnetic interference shielding layer.

The stiffener 1424 is connected to the leads 1406 with a conductive interconnection 1426. The conductive interconnection 1426 enhances the ability of the stiffener 1424 to act as an electromagnetic interference shielding by funneling current resulting from ionizing radiation to a grounding pin.

Figure 15:
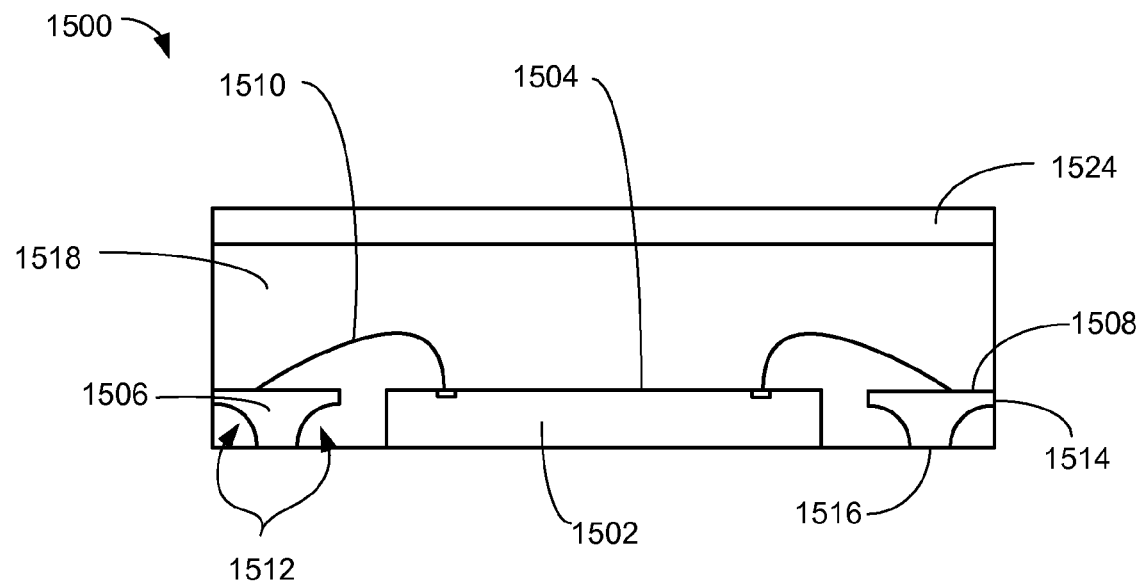
FIG. 15 is a cross-sectional view of an integrated circuit package system in an eighth embodiment of the present invention.

Referring now to FIG. 15, therein is shown a cross-sectional view of an integrated circuit package system 1500 in an eighth embodiment of the present invention. The integrated circuit package system 1500 is shown having an integrated circuit 1502 such as a wire-bonded die with an active side 1504.

On the periphery of the integrated circuit 1502, are leads 1506 having an upper surface 1508. The upper surface 1508 of the leads 1506 are connected to the active side 1504 of the integrated circuit 1502 with interconnects 1510 such as bond wires.

The leads 1506 are shown having a half-etched portion 1512 below the upper surface 1508 of the leads 1506. The leads 1506 are further shown exposed along a side 1514, a bottom 1516, and along part of the half-etched portion 1512.

To facilitate improved mechanical locking, the leads 1506 have the half-etched portion 1512 along the side 1514 and the bottom 1516 of the leads 1506. The leads 1506 may be pre-plated with Ni, Pt, Au or any combination of them. The leads 1506 also can be arranged in single or multiple row formats to match multiple levels of stacked die.

Encapsulating the interconnects 1510 and partially encapsulating the integrated circuit 1502 and the leads 1506, is a conformable material 1518. The conformable material 1518 has a low viscosity and, as temperature increases, the viscosity gets lower.

Therefore, the conformable material 1518 can be easily pressed over the interconnects 1510, above, and around the integrated circuit 1502 and the leads 1506, and then cured to harden the conformable material 1518.

The leads 1506 can be any shape and cross-section, such as T shape, trapezoid, L shape, etc, that enhances mechanical locking effect with the conformable material 1518. The conformable material 1518 is shown only partially encapsulating the half-etched portion 1512 of the leads.

It has been discovered that the conformable material 1518 should be a thermally conductive dielectric material. The conformable material 1518 can be made of a B-stage material that can be hardened after curing and can maintain a predetermined thickness.

The conformable material 1518 should be about 100° C. while encapsulating the integrated circuit 1502 before curing. The viscosity of the conformable material 1518 may be in a range of 10 Pa to 2000 Pa. It has still further been discovered that the elastic modulus of the conformable material 1518 before curing (B-stage) should be less than 300 MPa, and it should be greater than 3000 MPa after curing.

There should preferably be a difference about 10 X before and after curing. The elastic modulus should also drop as temperature increases before and after curing. Above the conformable material 1518, a stiffener 1524 is mounted.

The stiffener 1524 may be made of organic, metal, ceramic or other material, which is stiff enough to act as a support for the conformable material 1518 in its uncured or viscous state. When the stiffener 1524 is made by thermal or electrical conductive material, it can function as heat sink or electromagnetic interference shielding layer.

Figure 16:
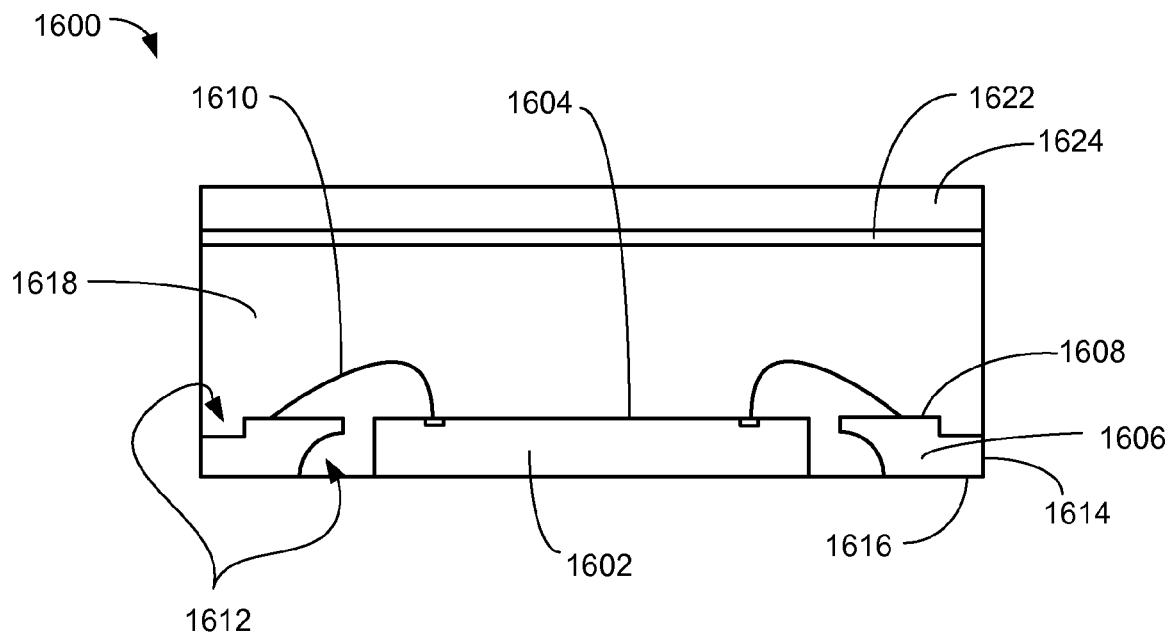
FIG. 16 is a cross-sectional view of an integrated circuit package system in a ninth embodiment of the present invention.

Referring now to FIG. 16, therein is shown a cross-sectional view of an integrated circuit package system 1600 in a ninth embodiment of the present invention. The integrated circuit package system 1600 is shown having an integrated circuit 1602 such as a wire-bonded die with an active side 1604.

On the periphery of the integrated circuit 1602, are leads 1606 having an upper surface 1608. The upper surface 1608 of the leads 1606 are connected to the active side 1604 of the integrated circuit 1602 with interconnects 1610 such as bond wires.

The leads 1606 are shown having a half-etched portion 1612 below the upper surface 1608 of the leads 1606. The leads 1606 are further shown exposed along a side 1614, a bottom 1616, and along part of the half-etched portion 1612.

To facilitate easier singulation, the leads 1606 have the half-etched portion 1612 along the side 1614 and the upper surface 1608 of the leads 1606. The leads 1606 may be pre-plated with Ni, Pt, Au or any combination of them. The leads 1606 also can be arranged in single or multiple row formats to match multiple levels of stacked die.

Encapsulating the interconnects 1610 and partially encapsulating the integrated circuit 1602 and the leads 1606, is a conformable material 1618. The conformable material 1618 has a low viscosity and, as temperature increases, the viscosity gets lower.

Therefore, the conformable material 1618 can be easily pressed over the interconnects 1610, above, and around the integrated circuit 1602 and the leads 1606, and then cured to harden the conformable material 1618.

The leads 1606 can be any shape and cross-section, such as T shape, trapezoid, L shape, etc, that enhances mechanical locking effect with the conformable material 1618. The conformable material 1618 is shown only partially encapsulating the half-etched portion 1612 of the leads.

It has been discovered that the conformable material 1618 should be a thermally conductive dielectric material. The conformable material 1618 can be made of a B-stage material that can be hardened after curing and can maintain a predetermined thickness.

The conformable material 1618 should be about 100° C. while encapsulating the integrated circuit 1602 before curing. The viscosity of the conformable material 1618 may be in a range of 10 Pa to 2000 Pa. It has still further been discovered that the elastic modulus of the conformable material 1618 before curing (B-stage) should be less than 300 MPa, and it should be greater than 3000 MPa after curing.

There should preferably be a difference about 10 X before and after curing. The elastic modulus should also drop as temperature increases before and after curing. Above the conformable material 1618, an adhesive layer 1622 attaches a stiffener 1624 to the conformable material 1618.

The stiffener 1624 may be made of organic, metal, ceramic or other material, which is stiff enough to act as a support for the conformable material 1618 in its uncured or viscous state. When the stiffener 1624 is made by thermal or electrical conductive material, it can function as heat sink or electromagnetic interference shielding layer.

Figure 17:
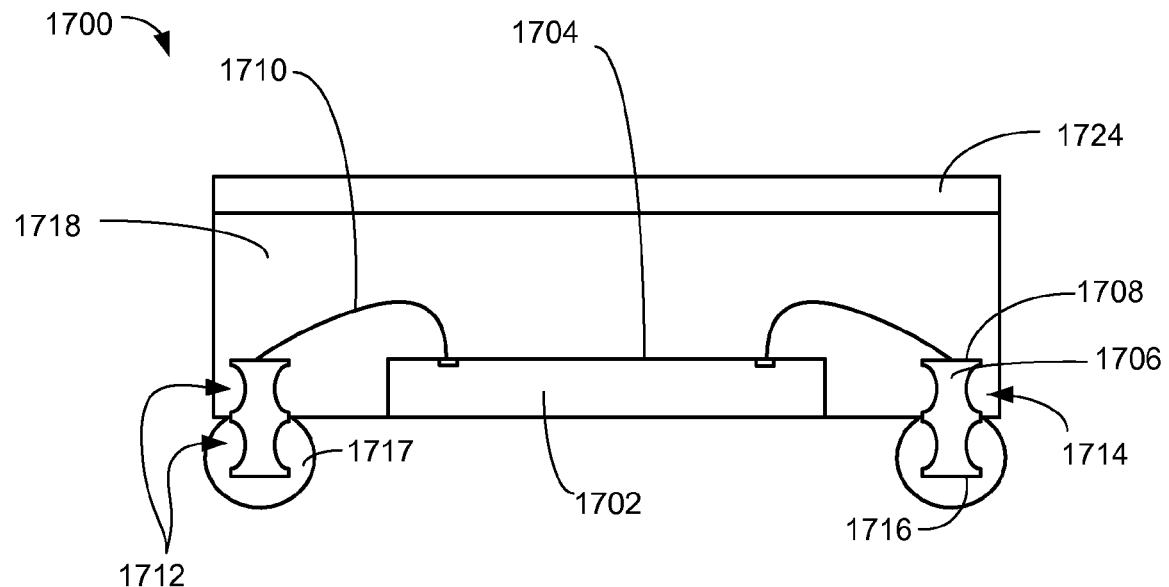
FIG. 17 is a cross-sectional view of an integrated circuit package system in a tenth embodiment of the present invention.

Referring now to FIG. 17, therein is shown a cross-sectional view of an integrated circuit package system 1700 in a tenth embodiment of the present invention. The integrated circuit package system 1700 is shown having an integrated circuit 1702 such as a wire-bonded die with an active side 1704.

On the periphery of the integrated circuit 1702, are leads 1706 having an upper surface 1708. The upper surface 1708 of the leads 1706 are connected to the active side 1704 of the integrated circuit 1702 with interconnects 1710 such as bond wires. The leads 1706 are shown having a half-etched portion 1712 along sides 1714 of the leads 1706.

To facilitate connection to a printed circuit board the leads have external interconnects 1717 such as solder balls attached to a bottom 1716 of the leads 1706. The leads 1706 may be pre-plated with Ni, Pt, Au or any combination of them. The leads 1706 also can be arranged in single or multiple row formats to match multiple levels of stacked die.

Encapsulating the interconnects 1710 and partially encapsulating the integrated circuit 1702 and the leads 1706, is a conformable material 1718. The conformable material 1718 has a low viscosity and, as temperature increases, the viscosity gets lower.

Therefore, the conformable material 1718 can be easily pressed over the interconnects 1710, above, and around the integrated circuit 1702 and the leads 1706, and then cured to harden the conformable material 1718.

The leads 1706 can be any shape and cross-section, such as T shape, trapezoid, L shape, etc, that enhances mechanical locking effect with the conformable material 1718. The conformable material 1718 is shown only partially encapsulating the half-etched portion 1712 of the leads.

It has been discovered that the conformable material 1718 should be a thermally conductive dielectric material. The conformable material 1718 can be made of a B-stage material that can be hardened after curing and can maintain a predetermined thickness.

The conformable material 1718 should be about 100° C. while encapsulating the integrated circuit 1702 before curing. The viscosity of the conformable material 1718 may be in a range of 10 Pa to 2000 Pa. It has still further been discovered that the elastic modulus of the conformable material 1718 before curing (B-stage) should be less than 300 MPa, and it should be greater than 3000 MPa after curing.

There should preferably be a difference about 10 X before and after curing. The elastic modulus should also drop as temperature increases before and after curing. Above the conformable material 1718, a stiffener 1724 is mounted.

The stiffener 1724 may be made of organic, metal, ceramic or other material, which is stiff enough to act as a support for the conformable material 1718 in its uncured or viscous state. When the stiffener 1724 is made by thermal or electrical conductive material, it can function as heat sink or electromagnetic interference shielding layer.

Figure 18:
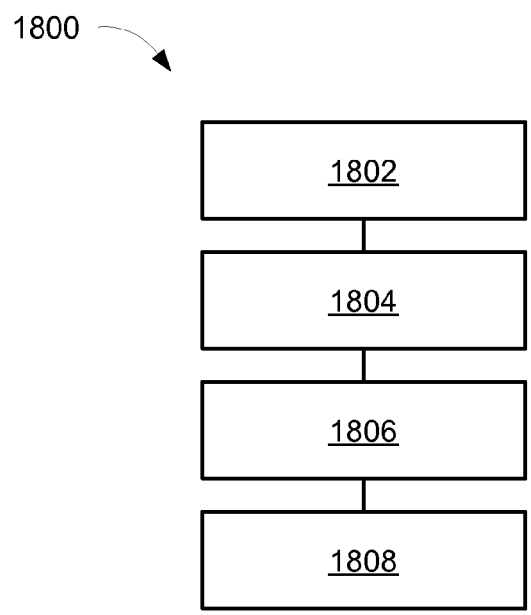
FIG. 18 is a flow chart of a system for manufacturing the integrated circuit package system of FIG. 1 in an embodiment of the present invention.

Referring now to FIG. 18, therein is shown a flow chart of a system 1800 for manufacturing the integrated circuit package system 100 of FIG. 1 in an embodiment of the present invention. The system 1800 includes providing an integrated circuit in a block 1802; mounting a lead on the periphery of the integrated circuit in a block 1804; connecting the integrated circuit to the lead with an interconnect in a block 1806; and forming a conformable material by pressing the conformable material on the integrated circuit, the lead, and the interconnect in a block 1808.

It has been discovered that the present invention thus has numerous aspects. As conventional molding process is replaced by isolative layer attaching and curing, manufacturing cost can be reduced in terms of shorter cycle time, less equipment investment, and simpler process.

Another aspect is as leads are partially embedded in an isolative layer, more wetting area is exposed during board level attachment and board level reliability can be improved.

Yet another aspect is lead-to-lead silver migration can be prevented.

Finally, another aspect is as no mold compound is used, there is no chemical or mechanical deflash process for mold flash removal from external I/Os, especially for multi-row configuration that encountered mold flash on lead during manufacturing.

These and other valuable aspects of the present invention consequently further the state of the technology to at least the next level.

Thus, it has been discovered that the conformable material system of the present invention furnishes important and heretofore unknown and unavailable solutions, capabilities, and functional aspects for integrated circuit package systems. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit package system comprising:
providing an integrated circuit;
mounting a lead on the periphery of the integrated circuit;
connecting the integrated circuit to the lead with an interconnect;
forming a conformable material by pressing the conformable material on the integrated circuit, the lead, and the interconnect;
attaching a stiffener to a buffer layer with an adhesive layer; and
attaching the buffer layer to the conformable material.

2. The system as claimed in claim 1 further comprising:
attaching a stiffener to the conformable material.

3. The system as claimed in claim 1 further comprising:
attaching a stiffener to the conformable material with an adhesive layer.

4. The system as claimed in claim 1 further comprising:
attaching a stiffener having a protrusion to the conformable material and having the protrusion in contact with the integrated circuit.

5. The system as claimed in claim 1 further comprising:
mounting the integrated circuit to a die pad having a half-etched portion.

6. The system as claimed in claim 1 wherein:
mounting a lead includes forming the half-etched portion along a side and bottom of the lead, along a side and upper surface of the lead, or a combination thereof.

7. The system as claimed in claim 1 further comprising:
mounting an external interconnect to the lead.

8. The system as claimed in claim 1 further comprising:
connecting the lead to the stiffener with a conductive interconnection.

9. An integrated circuit package system comprising:
an integrated circuit;
a lead mounted on the periphery of the integrated circuit;
an interconnect connecting the integrated circuit to the lead;
a conformable material pressed on the integrated circuit, the lead, and the interconnect;
a stiffener attached to a buffer layer with an adhesive layer; and
wherein:
the buffer layer is attached to the conformable material.

10. The system as claimed in claim 9 further comprising:
a stiffener attached to the conformable material.

11. The system as claimed in claim 9 further comprising:
a stiffener attached to the conformable material with an adhesive layer.

12. The system as claimed in claim 9 further comprising:
a stiffener having a protrusion attached to the conformable material and having the protrusion in contact with the integrated circuit.

13. The system as claimed in claim 9 wherein:
the lead has a half-etched portion; and
the interconnect connecting the integrated circuit to the lead is a bond wire, a solder ball, or a combination thereof.

14. The system as claimed in claim 13 further comprising:
a die pad having a half-etched portion mounted to the integrated circuit.

15. The system as claimed in claim 13 wherein:
the half-etched portion is formed along a side and bottom of the lead, along a side and upper surface of the lead, or a combination thereof.

16. The system as claimed in claim 13 further comprising:
an external interconnect mounted to the lead.

17. The system as claimed in claim 13 further comprising:
a conductive interconnection connecting the lead to the stiffener.

* * * * *